(12) United States Patent
Jeon et al.

(10) Patent No.: US 7,666,762 B2
(45) Date of Patent: Feb. 23, 2010

(54) METHOD FOR FABRICATING SEMICONDUCTOR DEVICE

(75) Inventors: Dong Ki Jeon, Gangneung-si (KR); Han Choon Lee, Poongnap-dong (KR)

(73) Assignee: Dongbu Hitek Co., Ltd., Seoul (KR)

( * ) Notice: Subject to any disclaimer, the term of this patent is extended or adjusted under 35 U.S.C. 154(b) by 26 days.

(21) Appl. No.: 11/863,442

(22) Filed: Sep. 28, 2007

(65) Prior Publication Data

US 2008/0145988 A1 Jun. 19, 2008

(30) Foreign Application Priority Data

Dec. 15, 2006 (KR) .................... 10-2006-0128451

(51) Int. Cl.
*H01L 21/322* (2006.01)
*H01L 21/44* (2006.01)

(52) U.S. Cl. .................. 438/475; 438/663; 438/664; 438/680; 438/682; 257/E21.165; 257/E21.199; 257/E21.438

(58) Field of Classification Search .......... 257/E21.165, 257/E21.199, E21.438
See application file for complete search history.

(56) References Cited

U.S. PATENT DOCUMENTS

| | | | |
|---|---|---|---|
| 2001/0045559 A1* | 11/2001 | Yamazaki et al. | 257/66 |
| 2004/0105934 A1* | 6/2004 | Chang et al. | 427/255.28 |
| 2005/0067661 A1* | 3/2005 | Choi | 257/408 |
| 2006/0281304 A1* | 12/2006 | Tsuchiaki et al. | 438/643 |
| 2007/0032057 A1* | 2/2007 | Choon | 438/592 |
| 2007/0141798 A1* | 6/2007 | Bohr | 438/301 |
| 2007/0298600 A1* | 12/2007 | Suh et al. | 438/586 |
| 2008/0137397 A1* | 6/2008 | Furukawa et al. | 365/151 |
| 2008/0146007 A1* | 6/2008 | Balseanu et al. | 438/483 |
| 2008/0242059 A1* | 10/2008 | McSwiney et al. | 438/475 |

FOREIGN PATENT DOCUMENTS

KR 10-2003-0101827 7/2005

* cited by examiner

*Primary Examiner*—Charles D Garber
*Assistant Examiner*—Mohsen Ahmadi
(74) *Attorney, Agent, or Firm*—Saliwanchik, Lloyd & Saliwanchik

(57) ABSTRACT

A method for fabricating a semiconductor device is provided. A nickel layer is deposited on a semiconductor substrate and plasma-processed. Rapid thermal processing is performed on the plasma-processed nickel layer to form a nickel silicide layer. The portion of the nickel layer that has not reacted with silicon is then removed.

13 Claims, 3 Drawing Sheets

METHOD FOR FABRICATING SEMICONDUCTOR DEVICE

CROSS-REFERENCE TO RELATED APPLICATION

The present application claims the benefit under 35 U.S.C. § 119 of Korean Patent Application No. 10-2006-0128451, filed Dec. 15, 2006, which is hereby incorporated by reference in its entirety.

BACKGROUND

When fabricating semiconductor devices, silicide, which is a compound of metal and silicon, is often included for electrical contact between a gate electrode, source/drain, and metal lines.

Cobalt silicide, which is a compound of cobalt and polysilicon, is often used for a semiconductor device fabricated in 0.18 μm or smaller technology. However, the resistance of the cobalt silicide rapidly increases as the width of a gate poly decreases to less than 65 nm. To overcome this limitation, nickel silicide, formed using nickel (Ni), can be used since it is less influenced by the width of the gate poly.

However, since Ni layers are typically deposited using physical vapor deposition (PVD), it makes it difficult to properly deposit the layers on narrow active regions (source/drain regions) between gates. Atomic layer deposition (ALD), which is a process of depositing a layer at an atomic level to reduce residual impurities in the layer, has been studied recently as a possible solution. In ALD, a Ni layer is formed through thermal decomposition at high temperature using Ni—$C_xH_y$. This Ni layer contains a large amount of carbon impurities, which increases the resistance when nickel silicide is formed.

BRIEF SUMMARY

Embodiments of the present invention provide a method for fabricating a semiconductor device that can improve the electrical characteristics of the semiconductor device by removing carbon impurities contained in a nickel layer.

A method for fabricating a semiconductor device includes: forming source/drain regions and device isolation regions in a semiconductor substrate; depositing a nickel layer on the semiconductor substrate; plasma-processing the nickel layer; performing rapid thermal processing on the plasma-processed nickel layer to form a nickel silicide layer; and removing the portion of the nickel layer that has not reacted with silicon.

The details of one or more embodiments are set forth in the accompanying drawings and the detailed description. Other features will be apparent to those skilled in the art from the detailed description, the drawings, and the appended claims.

DETAILED DESCRIPTION

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

FIGS. 1 to 5 are views illustrating a method for fabricating a semiconductor device according to an embodiment.

Figure 1:
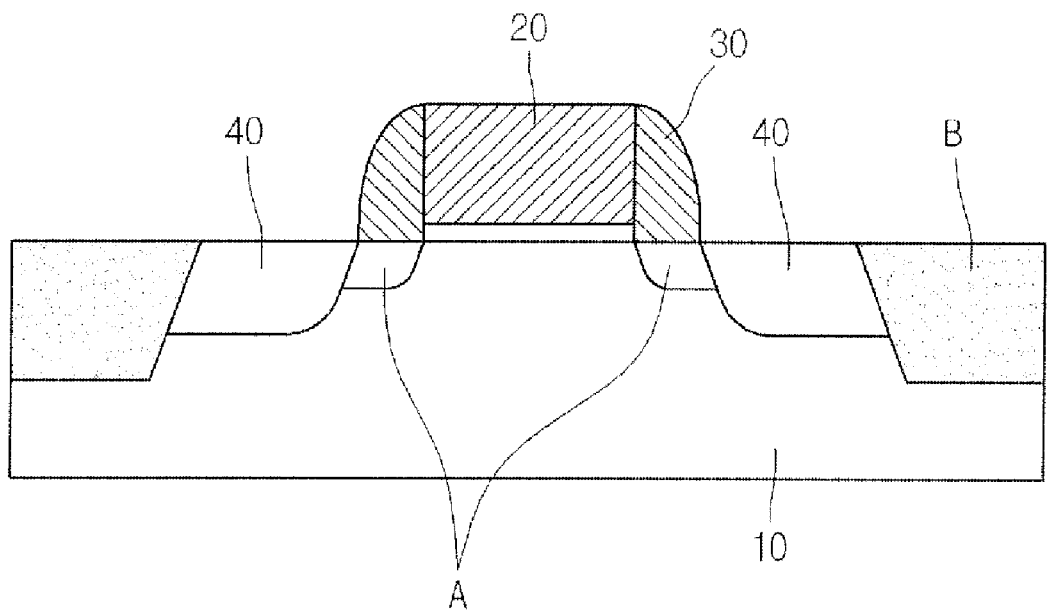
FIGS. 1 to 5 are views illustrating a method for fabricating a semiconductor device according to an embodiment of the present invention.

Referring to FIG. 1, the surface of a semiconductor substrate having device isolation regions B can be oxidized to form a gate oxide layer, and a polysilicon layer can be stacked on the gate oxide layer. The polysilicon layer can be formed on the gate oxide layer through a chemical vapor deposition (CVD) process.

Then, a photoresist can be coated on the polysilicon layer. Here, photoresist patterns can be reduction-projected onto the photoresist using an exposure apparatus such as a stepper, and the photoresist can be exposed and developed to form the photoresist patterns.

The polysilicon layer and the gate oxide layer can be dry-etched to form a gate structure 20. In an embodiment, the dry-etching is reactive ion etching (RIE) using the photoresist patterns as an etch mask.

Then, the photoresist patterns can be removed. Source/drain regions A (light doped drain (LDD)) of low concentration can be formed by implanting impurity ions at low concentration into the semiconductor substrate using the gate structure 20 including the polysilicon pattern and the gate oxide layer pattern as an ion implantation mask. Then, spacers 30 can be formed on the sidewalls of the gate structure 20.

High concentration impurity ions can be implanted using the gate structure 20 and the spacers 30 as an ion implantation mask. A thermal diffusion process can be performed to form source/drain regions 40 in predetermined regions of the semiconductor substrate.

Figure 2:
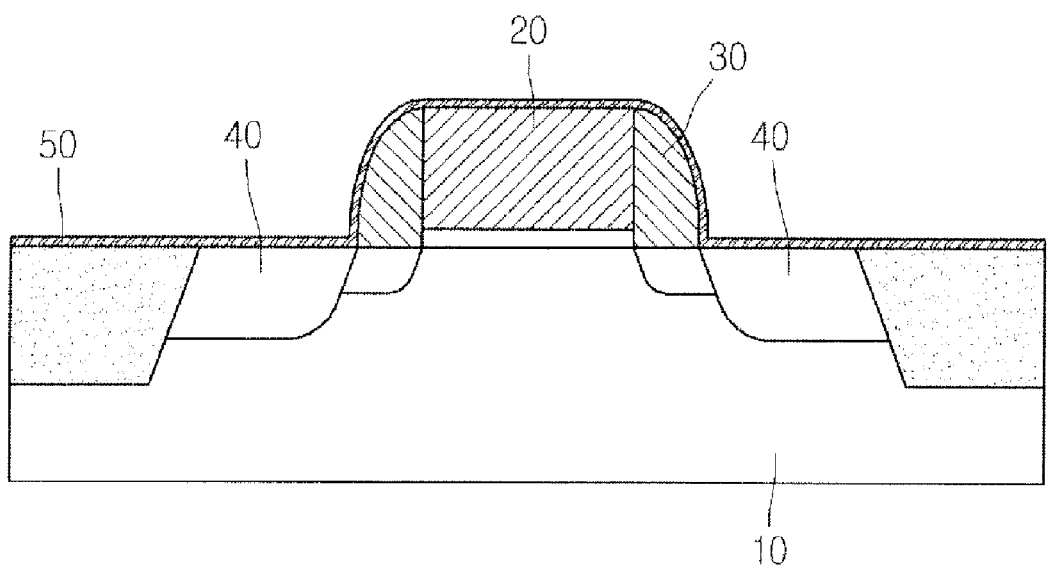

Referring to FIG. 2, a Ni layer 50 can be formed by depositing Ni on the semiconductor substrate. The Ni layer can be formed by atomic layer deposition (ALD). In an embodiment, the Ni is deposited on the entire surface of the semiconductor substrate.

In an embodiment, a Ni precursor can be carried into a deposition chamber by, for example, helium (He) gas. In a further embodiment, a Ni precursor can be provided into a deposition chamber by a direct liquid injection (DLI) process. Thermal decomposition can be performed at a temperature in the range of from about 300° C. to about 500° C. to form the Ni layer. In an embodiment, the Ni precursor is in the form of nickel-hydrocarbon (Ni—$C_xH_y$)

Figure 3:
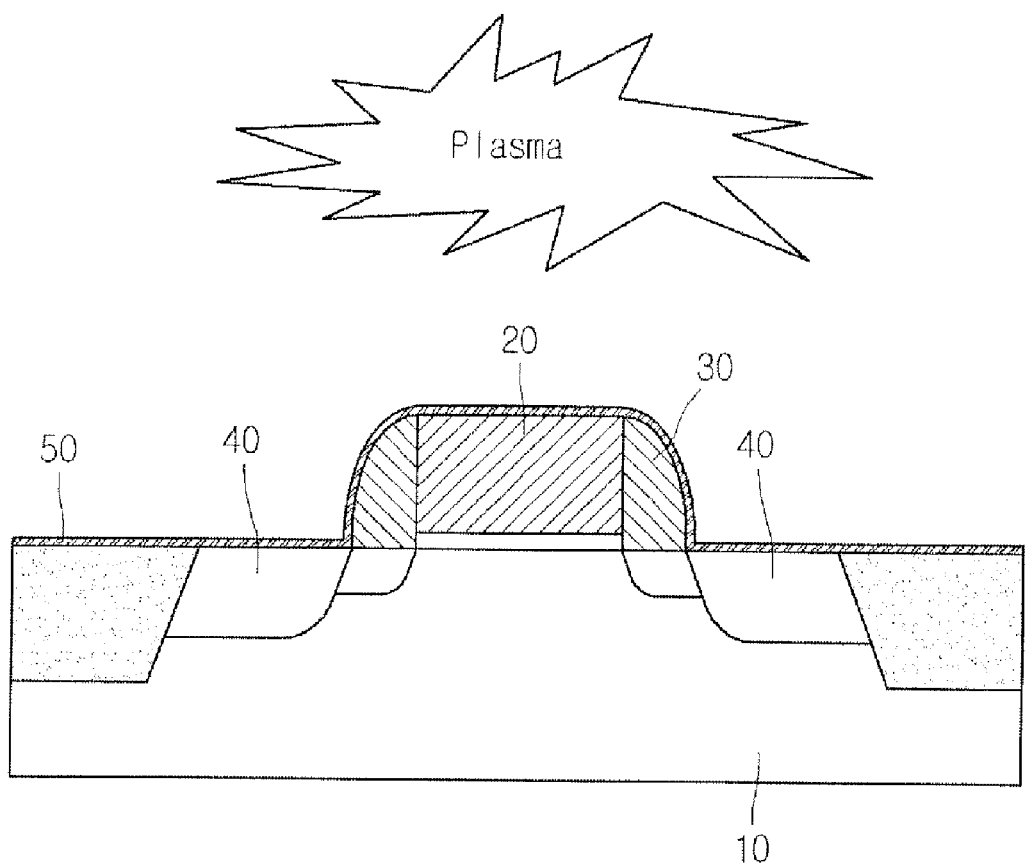

Referring to FIG. 3, a plasma process can be performed on the Ni layer 50 thermally decomposed and deposited from the Ni precursor to remove hydrocarbon impurities contained in the Ni precursor. In an embodiment, the plasma process uses hydrogen plasma. In a further embodiment, the plasma process uses plasma where hydrogen and nitrogen are mixed.

Figure 4:
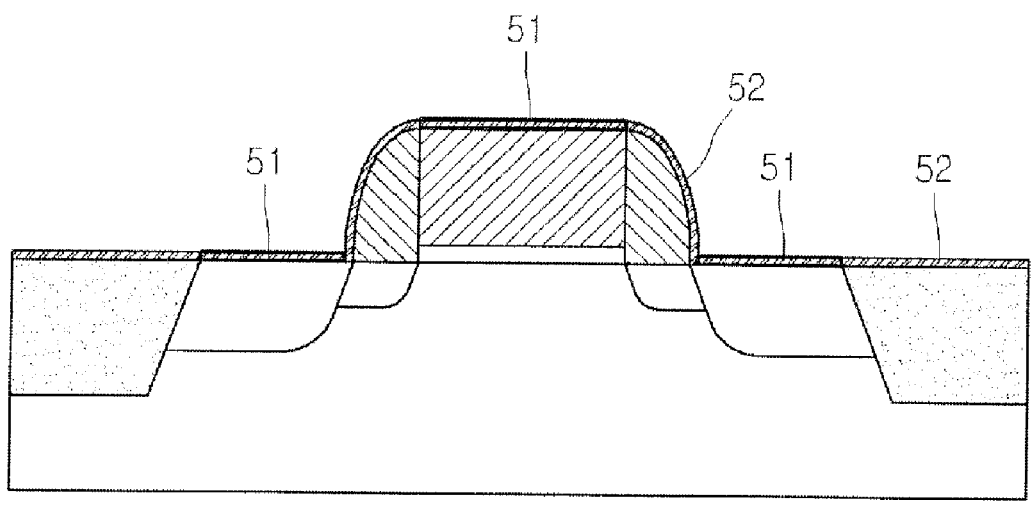

Referring to FIG. 4, rapid thermal processing (RTP) can be performed on the Ni layer from which the hydrocarbon impurities have been removed at a temperature in the range of from about 300° C. to about 600° C. to form a nickel silicide layer 51. The RTP can be performed for about 30 seconds to about 60 seconds.

Figure 5:
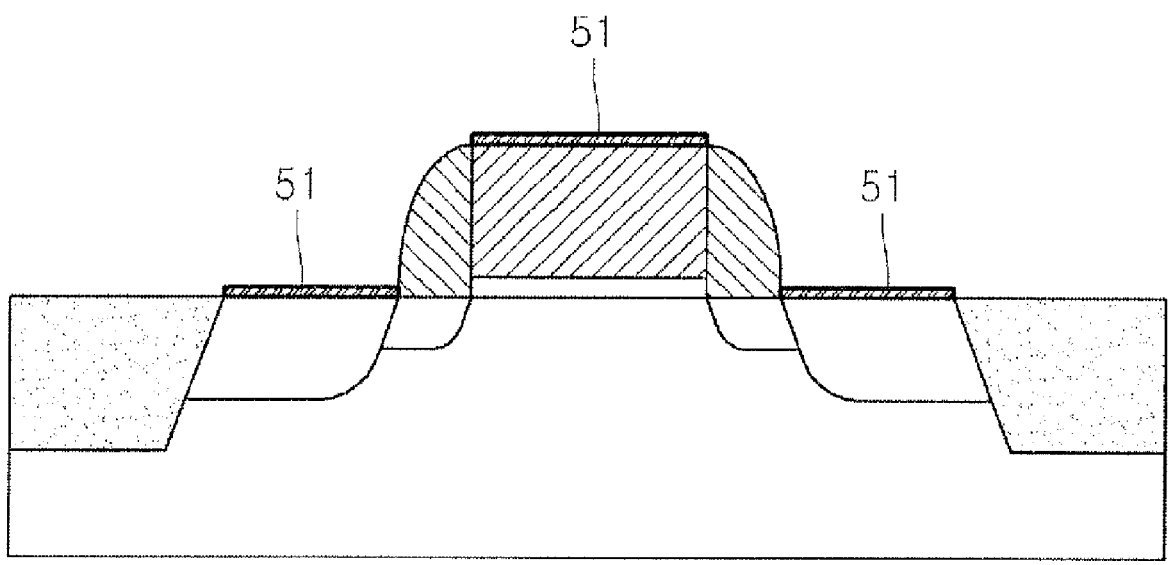

Referring to FIG. 5, an extra portion of the Ni layer 52 (refer to FIG. 4) that does not react with silicon can be removed using chemicals. The chemicals used to remove the unreacted portion 52 of the Ni layer can include $H_2SO_4$, $H_2O_2$, $H_2O$, or some combination thereof.

Since the nickel silicide layer 51 can be formed by depositing a Ni layer on the semiconductor substrate using AWED and plasma-processing the Ni layer, the carbon content of the Ni layer decreases, but some carbon can still exist in the nickel silicide layer.

Therefore, in an embodiment, the plasma process can be performed again after the nickel silicide layer is formed to remove the remaining carbon, thereby giving a nickel silicide layer having low resistance.

In an embodiment, residual impurities in a Ni layer can be reduced by depositing Ni on substantially the entire surface of a semiconductor substrate using ALD to form the Ni layer.

In embodiments that use a nickel-hydrocarbon as a Ni precursor, carbon impurities may be present. For example, $Ni_3C$ may be present in the nickel silicide layer. Therefore, to remove the carbon, in an embodiment, plasma can be applied to the nickel silicide layer to allow the carbon remaining in the nickel silicide layer to be extracted through bonding of active hydrogen and carbon.

Thus, plasma-processing can reduce the carbon content in the nickel silicide layer, thereby reducing the resistance of the nickel silicide layer.

According to an embodiment, a Ni layer having an even thickness can be deposited even when a gap between gates is narrow by depositing the Ni layer using ALD. Also, the contact resistance of a nickel silicide layer can be reduced by plasma-processing the Ni layer to effectively remove carbon existing in the Ni layer. In a further embodiment, a second plasma-processing can be performed on the nickel silicide layer. Accordingly, the electrical characteristics of a semiconductor device fabricated according to embodiments of the present invention, can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of the disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for fabricating a semiconductor device, comprising:
    depositing a nickel layer on a semiconductor substrate, wherein the nickel layer is deposited by using a nickel-hydrocarbon (Ni—$C_x$—$H_y$);
    plasma-processing the nickel layer, wherein the plasma-processing uses plasma where hydrogen and nitrogen are mixed;
    performing rapid thermal processing on the nickel layer to form a nickel silicide layer; and
    removing a portion of the nickel layer not reacted with silicon.

2. The method according to claim 1, further comprising forming a source/drain region and a device isolation region in the semiconductor substrate.

3. The method according to claim 1, wherein the nickel layer is deposited on substantially an entire surface of the semiconductor substrate.

4. The method according to claim 1, wherein the nickel layer is deposited using atomic layer deposition.

5. The method according to claim 1, wherein the nickel-hydrocarbon (Ni—$C_xH_y$) precursor is carried into a deposition chamber for depositing the nickel layer using a helium gas.

6. The method according to claim 1, wherein the nickel-hydrocarbon (Ni—$C_xH_y$) precursor is provided into a deposition chamber for depositing the nickel layer using a direct liquid injection process.

7. The method according to claim 1, wherein the nickel layer is formed by performing thermal decomposition in a deposition chamber at a temperature in the range of from about 300° C. to about 500° C.

8. The method according to claim 1, wherein the rapid thermal processing is performed at a temperature in the range of from about 300° C. to about 600° C.

9. The method according to claim 8, wherein the rapid thermal processing is performed for a period of time of from about 30 seconds to about 60 seconds.

10. The method according to claim 1, wherein removing the portion of the nickel layer not reacted with silicon comprises using at least one of the constituents selected from the group consisting of $H_2SO_4$, $H_2O_2$, and $H_2O$.

11. The method according to claim 1, further comprising performing a second plasma-processing after forming the nickel silicide layer.

12. The method according to claim 11, wherein the second plasma-processing uses hydrogen plasma.

13. The method according to claim 11, wherein the second plasma-processing uses a plasma where hydrogen and nitrogen are mixed.

* * * * *